(12) United States Patent
Chang et al.

(10) Patent No.: US 9,099,625 B2
(45) Date of Patent: Aug. 4, 2015

(54) LED PACKAGE AND METALLIC FRAME THEREOF

(71) Applicants: LITE-ON ELECTRONICS (GUANGZHOU) LIMITED, Guangzhou (CN); LITE-ON TECHNOLOGY CORP., Taipei (TW)

(72) Inventors: Yi-Chien Chang, Taipei (TW); Chen-Hsiu Lin, Taipei (TW); Meng-Sung Chou, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/164,553

(22) Filed: Jan. 27, 2014

(65) Prior Publication Data
US 2014/0217446 A1  Aug. 7, 2014

(30) Foreign Application Priority Data
Feb. 6, 2013 (CN) .......................... 2013 1 0048353

(51) Int. Cl.
*H01L 33/48* (2010.01)
*H01L 33/62* (2010.01)
*H01L 23/495* (2006.01)
*H01L 33/58* (2010.01)

(52) U.S. Cl.
CPC .............. *H01L 33/58* (2013.01); *H01L 33/486* (2013.01); *H01L 33/62* (2013.01); *H01L 2224/45144* (2013.01); *H01L 2224/48091* (2013.01); *H01L 2224/48247* (2013.01)

(58) Field of Classification Search
CPC ......... H01L 33/48; H01L 33/62; H01L 23/52; H01L 23/495; H01L 23/49541; H01L 23/49565; H01L 21/67236; H01L 23/49537; H01L 23/49575; H01L 23/49582; H01L 23/498; H01L 23/49861
See application file for complete search history.

(56) References Cited

U.S. PATENT DOCUMENTS

| | | | |
|---|---|---|---|
| 2011/0199749 A1* | 8/2011 | Lan et al. ....................... | 361/813 |
| 2012/0098110 A1* | 4/2012 | Zitzlsperger et al. ......... | 257/666 |
| 2013/0009190 A1* | 1/2013 | Memida .......................... | 257/98 |

* cited by examiner

*Primary Examiner* — Michael Jung
*Assistant Examiner* — Mikka Liu
(74) *Attorney, Agent, or Firm* — Rosenberg, Klein & Lee

(57) ABSTRACT

A light emitting diode package includes a metallic frame, and an LED chip disposed on the metallic frame. The metallic frame includes first and second metal plates arranged side by side with a space therebetween, and two support arms extending integrally and respectively from two opposite ends of the second metal plate to a level higher than the second top surface and that further extend toward the first metal plate at a level higher than the first top surface crossing the space. The support arms are not in contact with the first metal plate. An encapsulant encapsulates the metallic frame and the LED chip. At least a region of the encapsulant that covers the LED chip is transparent.

21 Claims, 7 Drawing Sheets

LED PACKAGE AND METALLIC FRAME THEREOF

CROSS-REFERENCE TO RELATED APPLICATION

This application claims priority of Chinese Patent Application No. 201310048353.4, filed on Feb. 6, 2013.

FIELD OF THE INVENTION

This invention relates to a metallic frame and a package, more particularly to a metallic frame having a supporting structure and a package for packaging a light emitting diode and having the metallic frame.

DESCRIPTION OF THE RELATED ART

Referring to FIG. 1, a conventional light emitting diode (LED) package 9 that is formed by a QFN (Quad-flat no-leads) packaging technology usually includes a metallic frame composed of two metal plates 91, 92, a light emitting diode (LED) chip 93 and an encapsulant 94 that is formed by curing and that encapsulates the metallic frame and the LED chip 93. One of the metal plates 91, 92 is greater in size than the other. The LED chip 93 is mounted to the bigger metal plate 91, and is electrically connected to the metal plates 91, 92 by wire bonding. The metal plates 91, 92 and the encapsulant 94 will be expanded or contracted in response to the temperature change of the LED chip 93. That is, when the LED chip 93 starts emitting light, the metal plates 91, 92 and the encapsulant 94 expand, and when the LED chip 93 stops emitting light, the metal plates 91, 92 and the encapsulant 94 contract. Because the thermal expansion coefficient of the encapsulant 94 is larger than that of the metal plates 91, 92, the smaller metal plate 92 tends to follow the expansion and contraction of the encapsulant 94, so that it warps along with the encapsulant 94. This leads to the risk of breaking the gold wires 95 that are connected to the metal plates 91, 92 after multiple times of expansion and contraction.

SUMMARY OF THE INVENTION

Therefore, an object of the present invention is to provide a light emitting diode package that can suppress warpage.

Another object of the present invention is to provide a metallic frame of a light emitting diode package that has a support structure to suppress warpage.

The advantage of the present invention resides in that because of the first support arms of the metallic frame is not coplanar with the first and second metal plates, displacement and warpage of the second metal plate relative to the first metal plate can be suppressed when the encapsulant expands and contracts so that the risk of breaking the gold wires that interconnect the LED chip and the second metal plate can be reduced. Hence, reliability of the light emitting diode package can be enhanced. Further, each support arm can include a curved section, so that not only warpage can be suppressed, but also light emitted from the LED chip can be reflected, thereby increasing efficiency of light emission. The metallic frame can further include a third metal plate. By using the support arms of the second and third metal plates to suppress warpage, probability of breaking the wires can be lowered. Moreover, by using the second and third metal plates, the electrical and thermal conduction paths can be redesigned, the separation effect of electrical and thermal conduction paths of the LED package can be achieved, thereby enhancing reliability of the product.

BRIEF DESCRIPTION OF THE DRAWINGS

Other features and advantages of the present invention will become apparent in the following detailed description of the preferred embodiments of the invention with reference to the accompanying drawings, in which.

DETAILED DESCRIPTION OF THE PREFERRED EMBODIMENTS

Figure 1:
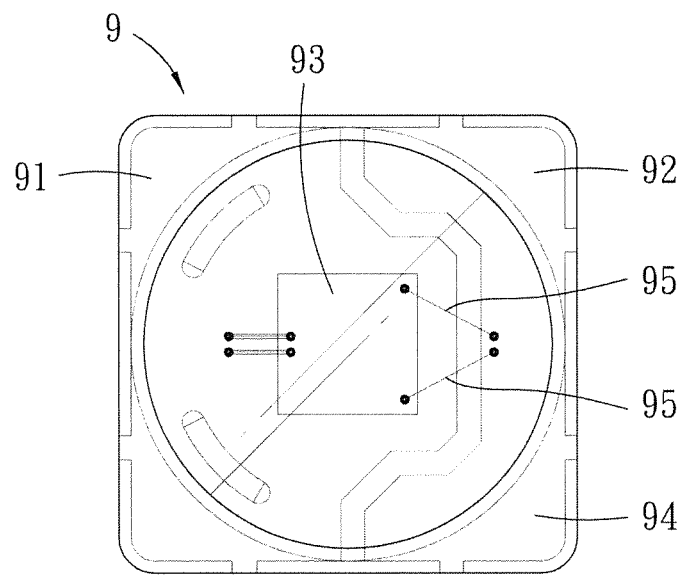
FIG. 1 is a schematic top view of an existing light emitting diode package.
Figure 2:
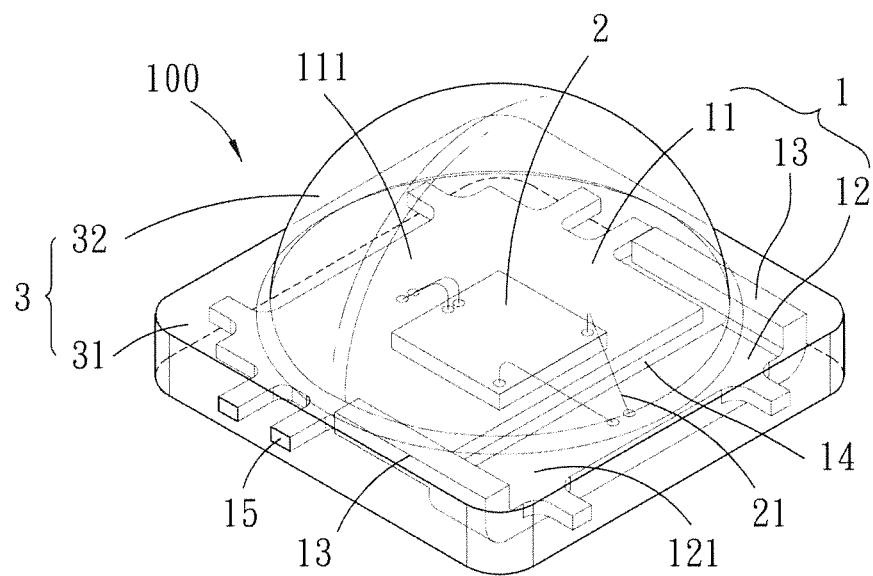
FIG. 2 is a perspective view of a light emitting diode package according to the first preferred embodiment of this invention.
Figure 3:
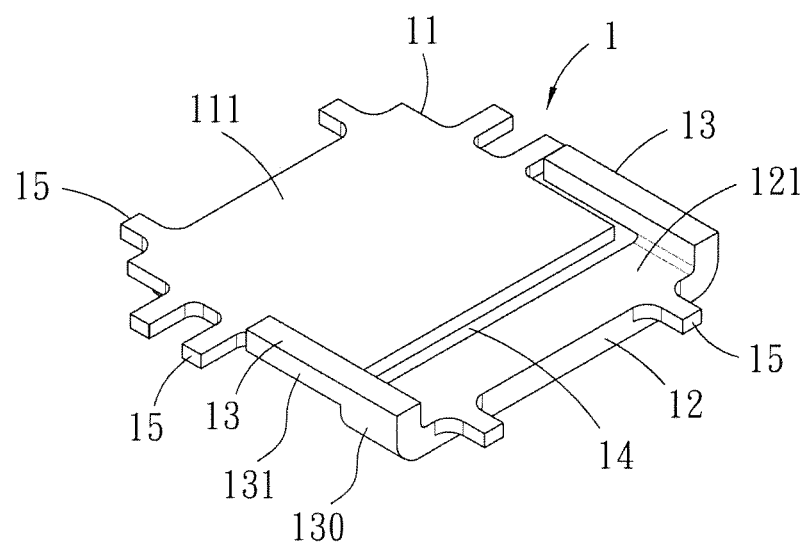
FIG. 3 is a perspective view of a metallic frame of the first preferred embodiment.

The above-mentioned and other technical contents, features, and effects of this invention will be clearly presented from the following detailed description of the preferred embodiments in coordination with the reference drawings.

Referring to FIGS. 2 to 6, a light emitting diode (LED) package 100 according to the first preferred embodiment of the present invention comprises a metallic frame 1, a light emitting diode (LED) chip 2 and an encapsulant 3.

The metallic frame 1 includes a first metal plate 11, a second metal plate 12, two first support arms 13 and a plurality of connecting lugs 15 projecting from the first and second metal plates 11, 12. The first metal plate 11 has a first top surface 111, a first bottom surface 112, and an indented portion 113 formed in the first bottom surface 112 and dividing the same into two parts. The second metal plate 12 has a second top surface 121 coplanar with the first top surface 111, and a second bottom surface 122 coplanar with the first bottom surface 112. The first and second metal plates 11, 12 are arranged side by side with a first space 14 therebetween. The first top surface of the first metal plate 11 has an area larger than that of the second top surface of the second metal plate 12. The first support arms 13 extend integrally and respectively from two opposite ends of the second metal plate 12 to a level higher than the second top surface 121, and further extend toward the first metal plate 11 at a level higher than the first top surface 111 crossing the first space 14. Especially, the first top surface 111 of the first metal plate 11 also can have an area equal to that of the second top surface 121 of the second metal plate 12, such that a flip-type LED chip 2 can flip over the first top surface 111 and the second top surface 121. In this embodiment, the first support arms 13 are extended from the second metal plate 12, but is not limited thereto. The first support arms 13 may also extend from the first metal plate 11 having a larger area. Whether the first support arms 13 extend from the first metal plate 11 or from the second metal plate 12, the warpage can be suppressed.

Each first support arm 13 includes a connecting section 130 extending curvedly and upwardly from the second metal plate 12, and an extension section 131 extending straightly from a top end of the connecting section 130 toward the first metal plate 11. The extension sections 131 of the first support arms 13 of the second metal plate 12 extend along a length direction in a parallel and symmetric manner. The first metal plate 11 is adjacent to the second metal plate 12 and spaced apart from the second metal plate 12 along the length direction. The first support arms 13 are not in contact with the first metal plate 11 to avoid causing a short circuit. The first metal plate 11, the second metal plate 12 and the first space 14 have a total length along a length direction of the first support arms 13 defined as (A). Each first support arm 13 has a length defined as (L). The total length (A) does not include the lengths of the connecting lugs 15 that project from the first and second metal plates 11, 12.

In this embodiment, each first support arm 13 extends from the second metal plate 12 toward the first metal plate 11. In an alternative embodiment, each first support arm 13 may extend from the first metal plate 11 toward the second metal plate 12, and also has the effect of reducing shearing force of the LED package 100, so that the structure of each support arm 13 is not limited to this embodiment.

The LED chip 2 is disposed on the metallic frame 1. Specifically, the LED chip 2 is mounted to the first metal plate 11, and positive and negative electrodes of the LED chip 2 are electrically connected to the first and second metal plates 11, 12 by using a plurality of gold wires 21. Although only one LED chip 2 is exemplified in this embodiment, it is understood that a plurality of the LED chips 2 may be provided.

The encapsulant 3 encapsulates the metallic frame 1 and the LED chip 2, and exposes the first and second bottom surfaces 112, 122 of the metallic frame 1. Through the exposed first and second bottom surfaces 112, 122, the LED package 100 can be soldered to a circuit board (not shown). In this embodiment, the encapsulant 3 is made in one piece from a transparent material, and includes a base portion 31, and a lens body 32 projecting from the base portion 31. A material of the base portion 31 fills the first space 14 between the first and second metal plates 11, 12 and the indented portion 113 of the first metal plate 11. As such, the first and second metal plates 11, 12 can remain electrically insulated from each other, and combination between the encapsulant 3 and the metallic frame 1 can be more stable. Light emitted from the LED chip 2 will have a property of uniformity by passing through the lens body 32. In addition, a fluorescent material is coated on a surface of the LED chip 2 or the lens body 32, so that light generated by the LED chip 2 can mix with that of the fluorescent material.

Figure 4:
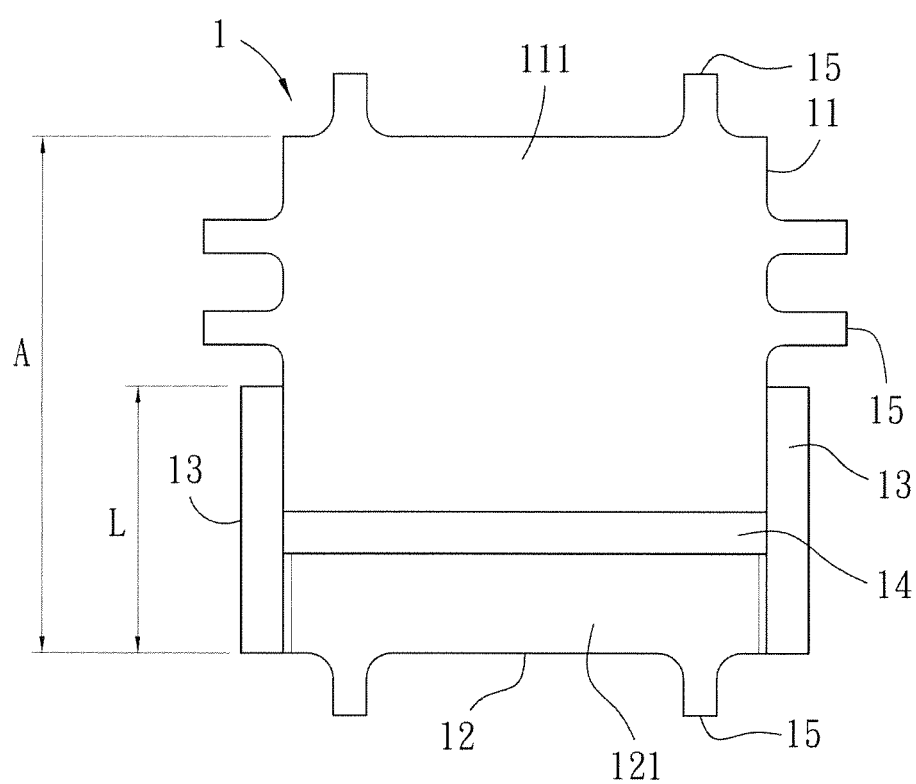
FIG. 4 is a schematic top view of the metallic frame of the first preferred embodiment.
Figure 5:
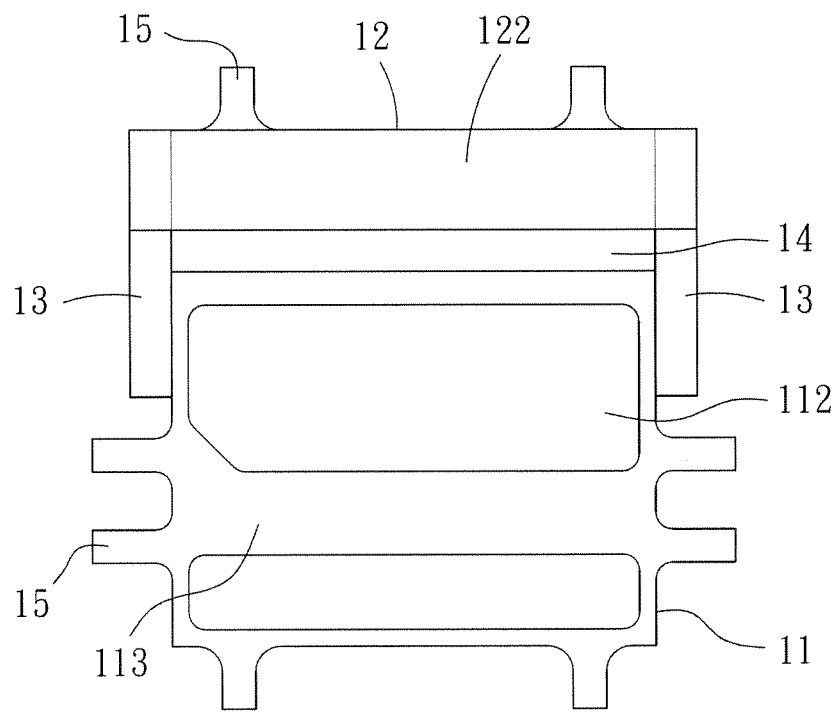
FIG. 5 is a schematic bottom view of the metallic frame of the first preferred embodiment.
Figure 6:
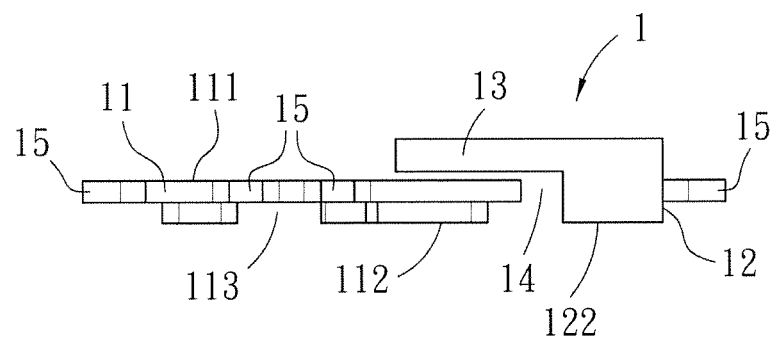
FIG. 6 is a schematic side view of the metallic frame of the first preferred embodiment.

With the first support arms 13 of the metallic frame 1 extending upwardly from the two opposite ends of the second metal plate 12 and further extending toward the first metal plate 11 crossing the first space 14, the first support arms 13 are not formed on a plane where the first and second metal plates 11, 12 are disposed, so that the first support arms 13 can suppress the second metal plate 12 from following the thermal expansion and cool contraction of the encapsulant 3 and from displacing and warping relative to the first metal plate 11. This reduces the shearing force of the LED package 100. The risk of breaking the gold wires 21 that interconnect the LED chip 2 and the second metal plate can thus be reduced, thereby enhancing the reliability of the LED package 100. The first support arms 13 should at least cross the first space 14 between the first and second metal plates 11, 12. That is, as shown in FIG. 4, the first support arms 13 extend from the second metal plate 12 in a direction toward the first metal plate 11, and have ends that pass through a lateral side of the first metal plate 11 that is adjacent to the first space 14. Further, the length (L) of each first support arm 13 is preferably greater than one-third of the total length (A), but smaller than the total length (A), which is expressed as A>L>A/3, so that the first support arms 13 have a supporting effect. By simulation software, analysis is made on the changes of stress of the gold wires 21 that interconnect the LED chip 2 and the second metal plate 12 during thermal cycling, and is compared with the LED package 9 of FIG. 1. Simulation analysis result shows that the LED package 9 of FIG. 1 has a stress of 954 Mpa per unit area, whereas the LED package 100 of this embodiment has a stress of 832 Mpa per unit area. The stress of the LED package 100 of this embodiment when compared with that of the conventional LED package 9 is reduced by 13% because of the support provided by the first support arms 13. Hence, through the support of the first support arms 13, the impact of changes in the stress on the gold wires 21 can be reduced, so that the risk of breaking the gold wires 21 is also reduced. Reliability of the LED package 100 can thus be enhanced.

Moreover, compared to the metal plate 91 shown in FIG. 1, the first top surface of the first metal plate 11 of this embodiment has a rectangular shape, and has a relatively large chip-mounting area, so that the first metal plate 11 not only can accommodate many LED chips 2, but also can provide good heat dissipation effect. Similarly, the second top surface of the second metal plate of this embodiment also has a rectangular shape, and has a relatively small area for wire-bonding.

In this embodiment, the LED package 100 is fabricated using a QFN packaging technology. The metallic frame 1 is formed by etching and half-etching a metal plate. The metal plate is bent upwardly after etching to form the first support arms 13.

Figure 7:
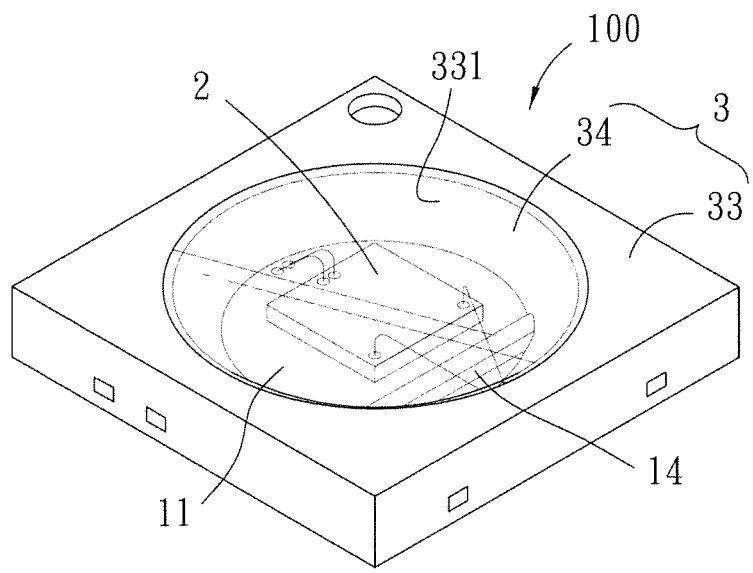
FIG. 7 is a perspective view of a light emitting diode package according to the second preferred embodiment of this invention.
Figure 8:
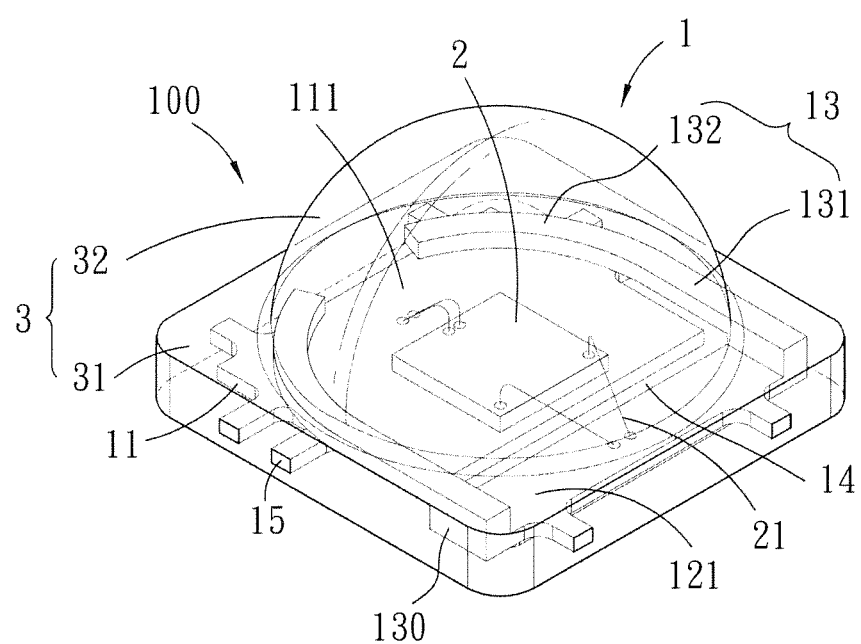
FIG. 8 is a perspective view of a light emitting diode package according to the third preferred embodiment of this invention.
Figure 9:
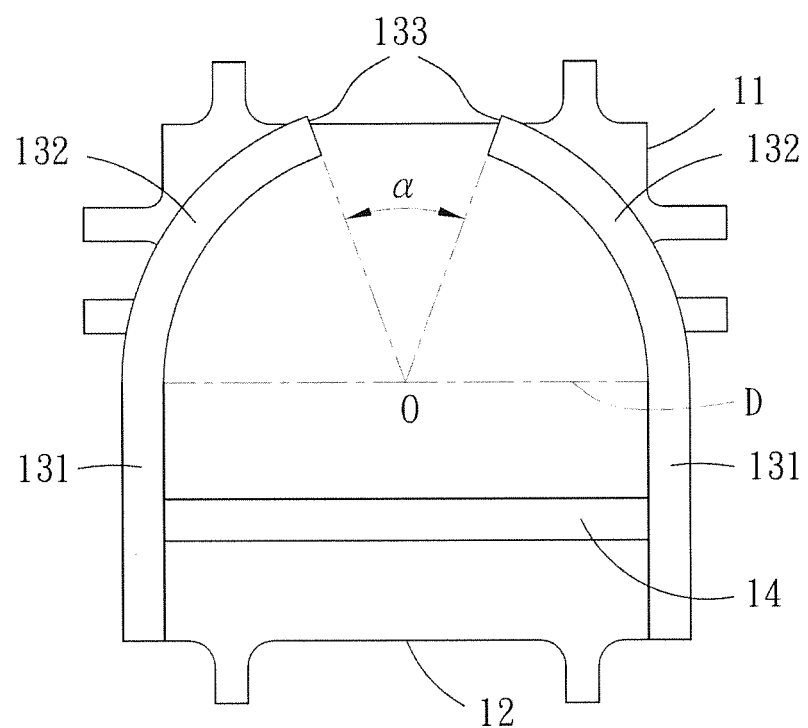
FIG. 9 is a schematic top view of a metallic frame of the third preferred embodiment.
Figure 10:
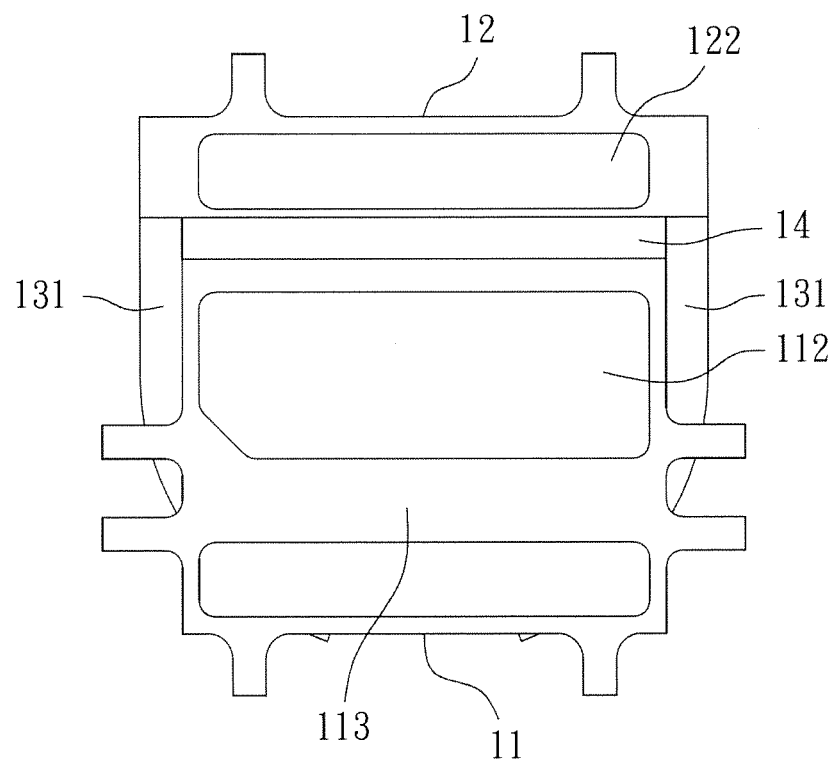
FIG. 10 is a schematic bottom view of the metallic frame of the third preferred embodiment.
Figure 11:
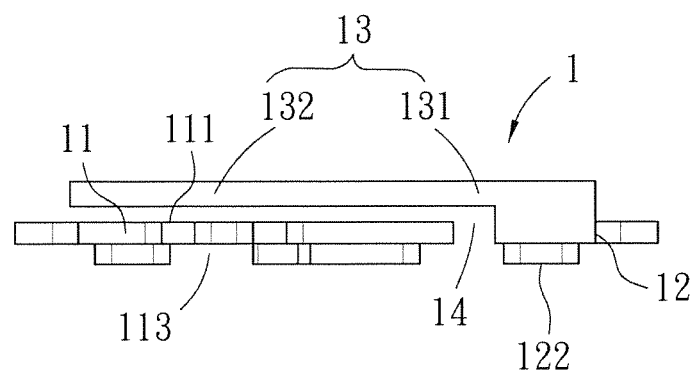
FIG. 11 is a schematic side view of the metallic frame of the third preferred embodiment.

Referring to FIG. 7, the second preferred embodiment of the LED package 100 according to this invention is shown to be similar to the first preferred embodiment. The difference between the first and second preferred embodiments resides in that, in the second preferred embodiment, the encapsulant 3 includes a non-transparent frame portion 33 and a transparent light exit portion 34. The frame portion 33 defines a cavity 331 that surrounds the LED chip 2, and a material of the frame portion 33 fills the first space 14 between the first and second metal plates 11, 12 and the indented portion 113 of the first metal plate 11 (see FIG. 5). A material of the light exit portion 34 fills the cavity 331 and covers the LED chip 2. Through the structure of the cavity 331, light emitting from a lateral side of the LED chip 2 can be reflected, thereby enhancing the uniformity of light emission. The light exit portion 34 may be made by mixing fluorescent powder with a transparent encapsulant, or after a surface of the LED chip 2 is coated with a fluorescent material, a transparent encapsulant is covered thereto to form the light exit portion 34. As such, light generated from the LED chip 2 can mix with the light generated from the fluorescent material.

Referring to FIGS. 8 to 11, the third preferred embodiment of the LED package 100 according to this invention is shown to be similar to the first preferred embodiment. The difference resides in that the first support arms 13 of the metallic frame 1 are further bent. Specifically, in the third preferred embodiment, each of the first support arms 13 includes a connecting section 130 connected perpendicularly to the second metal plate 12, an extension section 131 extending straightly from the connecting section 130 toward the first metal plate 11, and a curved section 132 extending curvedly from the extension section 131 toward a curved section 132 of the other one of the first support arms 13. The curved sections 132 of the first support arms 13 are located above the first metal plate 11. The curvatures of the curved sections 132 of the first support arms 13 have a common center point (O) on a line that connects a junction of the extension section 131 and the curved section 132 of one of the first support arms 13 to a junction of the extension section 131 and the curved section 132 of the other one of the first support arms 13. Ends of the curved sections 132 of the first support arms 13 are spaced apart from each other and subtend an included angle ($\alpha$) at the common center point (O). The included angle ($\alpha$) ranges from 20 to 160 degrees, preferably from 30 to 120 degrees. In this embodiment, the included angle ($\alpha$) is 40 degrees. Further, the metallic frame 1 is formed by etching and half-etching a metal plate.

In this embodiment, in addition to the first support arms 13 being able to suppress the second metal plate from following the thermal expansion and cool contraction of the encapsulant 3 and from displacing and warping relative to the first metal plate 11, when the encapsulant 3 is similar to that of the first preferred embodiment which is completely transparent, the curved sections 132 of the first support arms 13 are radially disposed above the first metal plate and surround the chip-mounting area that the LED chip is mounted thereon. Therefore, the curved section 132 of the first support arm 13 can also be used to reflect the light emitted from the LED chip 2 to increase the light emission efficiency. Especially, when the included angle ($\alpha$) between the first support arms 13 ranges from 30 to 120 degrees, the light emission efficiency is better. Table 1 illustrates comparison values of lumen (lm) resulting from simulation analysis for the first support arms that have different included angles ($\alpha$). Here, the lumen of the LED package with the included angle ($\alpha$) of the first support arms at 180 degrees is taken as a basis. By comparing the lumen in conditions that the first support arms are at each angle, it is found that the included angle ($\alpha$) which ranges from 30 to 120 degrees is better.

TABLE 1

| | Included Angle ($\alpha$) | | | | | | |
|---|---|---|---|---|---|---|---|
| | 0 | 20 | 30 | 40 | 90 | 120 | 180 |
| Lumen (lm) % | 99.50 | 99.20 | 100.40 | 104.00 | 103.80 | 100.60 | 100.00 |

Figure 12:
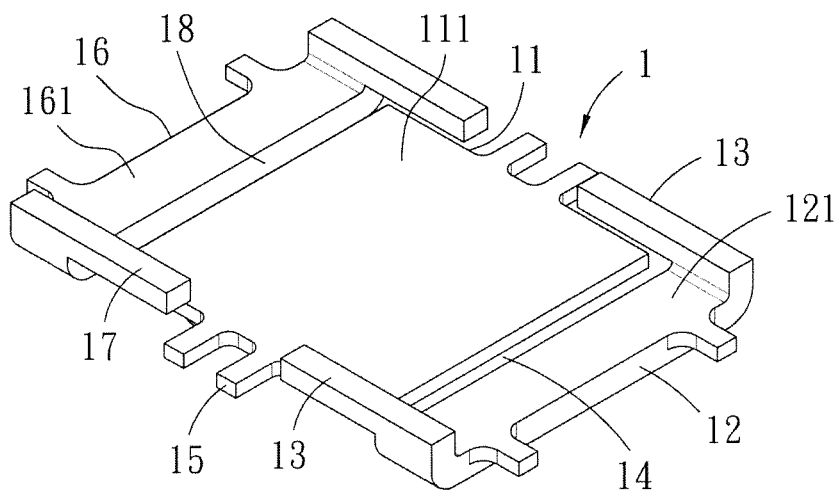
FIG. 12 is a perspective view of a metallic frame of a light emitting diode package according to the fourth preferred embodiment of this invention.
Figure 13:
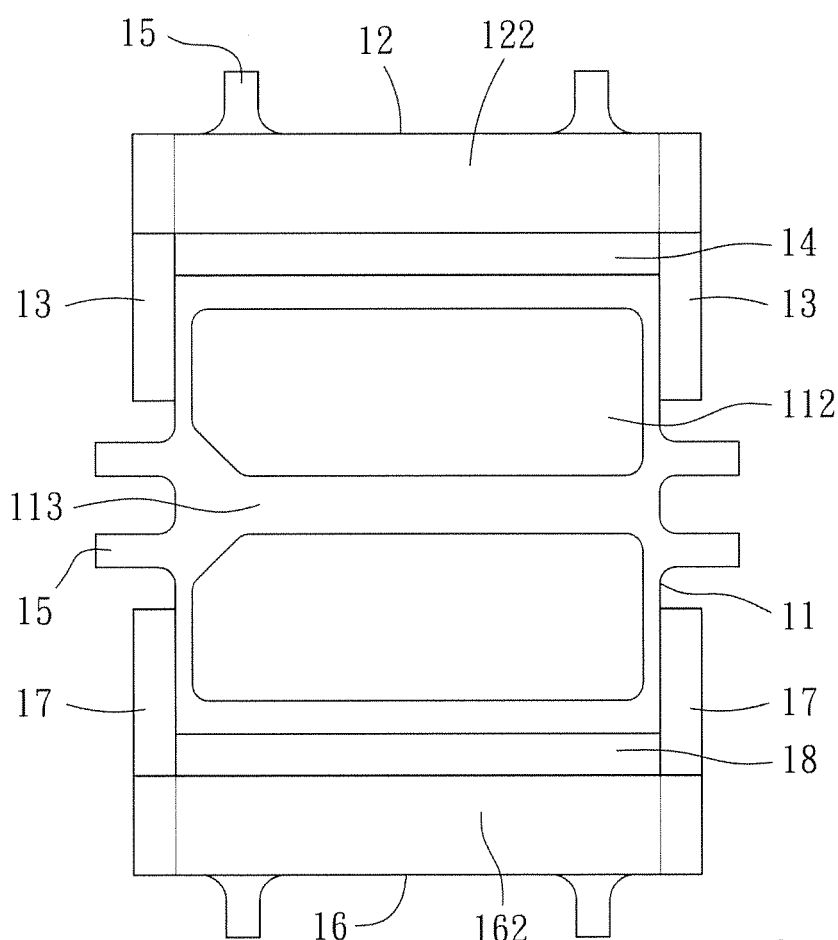
FIG. 13 is a schematic bottom view of the metallic frame of the fourth preferred embodiment.

Referring to FIGS. 12 and 13, the fourth preferred embodiment of the LED package 100 according to this invention is shown to be similar to the first preferred embodiment. The difference resides in that the metallic frame 1 further includes a third metal plate 16 and two second support arms 17.

The third metal plate 16 and the first metal plate 11 are arranged side by side with a second space 18 therebetween. The third metal plate 16 has a third top surface 161 coplanar with the first top surface 111, and a third bottom surface 162 coplanar with the first bottom surface 112. The first top surface of the first metal plate has an area larger than that of the second top surface of the second metal plate, and larger than that of the third top surface of the third metal plate. The first top surface of the first metal plate, the second top surface of the second metal plate, and the third top surface of the third metal plate provided for chip-mounting or wire-bonding have a rectangular shape. The second support arms 17 extend integrally and respectively from two opposite ends of the third metal plate 13 to a level higher than the third top surface 161, and further extend toward the first metal plate 11 at a level higher than the first top surface 111 crossing the second space 18. The second support arms 17 are not in contact with the first metal plate 11. In brief, the metallic frame 1 in this embodiment has the first metal plate 11 as the center, so that the second metal plate 12 along with the first support arms 13 and the third metal plate 16 along with the second support arms 17 are symmetrically disposed at two opposite sides of the first metal plate 11. In this way, apart from effectively lowering the risk of breaking the gold wires 21 (see FIG. 2), an electrical conduction path and a thermal conduction path of the LED chip 2 can also be separated, thereby achieving the effect of electrical and thermal separation.

Furthermore, the length (L) of each first support arm 13 and the length (L) of each second support arm are preferably greater than one-third of the total length (A), but smaller than the total length (A), which is expressed as A>L>A/3, so that the first support arms 13 have a supporting effect. Here, where (A) is total length of the first metal plate, the second metal plate, the third metal plate, the first space and the second space along a length direction of the first and second support arms. Further, the area of the first metal plate 11 may be adjusted according to the number of the LED chip 2, and each of two opposite lateral sides of the first metal plate 11 may be provided with only one connecting lug 15. It is preferable that the other two opposite sides of the first metal plate 11 that are respectively adjacent to the second and third metal plates 12, 16 are symmetrical, so that a wire-bonding process for electrical connection of the LED chip 2 with the second and third metal plate 12, 16 is easier.

To sum up, because of the support provided by the first support arms 13 of the metallic frame, the risk of breaking the gold wires 21 that are connected to the LED chip 2 can be reduced, thereby enhancing the reliability of the LED package 100. Further, each first support arm 13 can include a curved section 132 to reflect light emitted from the LED chip 2 so as to increase light emission efficiency. Moreover, the first metal plate 11 has a large chip-mounting area so that many LED chips 2 may be disposed thereto, and has a good heat dissipation capability. Additionally, when the metallic frame 1 has three metal plates, not only the risk of breaking the wires can be reduced, the effect of electrical and thermal separation of the LED package 100 can also be achieved. The reliability of the product can thus be enhanced.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:
1. A light emitting diode package, comprising:
a metallic frame including
a first metal plate having a first top surface and a first bottom surface, a second metal plate having a second top surface coplanar with said first top surface, and a second bottom surface coplanar with said first bottom surface, said first and second metal plates being arranged side by side with a space therebetween, and two support arms that extend integrally and respectively from two opposite ends of said second metal plate to a level higher than said second top surface and that further extend toward said first metal plate at a level higher than said first top surface crossing said space, said support arms being not in contact with said first metal plate;

at least one LED chip disposed on said metallic frame; and an encapsulant encapsulating said metallic frame and said LED chip and exposing said first and second bottom surfaces, wherein at least a region of said encapsulant that covers said LED chip is transparent.

2. The light emitting diode package of claim 1, wherein said first top surface of said first metal plate has an area larger than that of said second top surface of said second metal plate.

3. The light emitting diode package of claim 1, wherein said first top surface of said first metal plate has an area equal to that of said second top surface of said second metal plate, and said LED chip is flipped over said first top surface and said second top surface.

4. The light emitting diode package of claim 2, wherein (A)>(L)>(A/3), where (A) is total length of said first metal plate, said second metal plate and said space along a length direction of said support arms, and (L) is length of each of said support arms.

5. The light emitting diode package of claim 2, wherein each of said support arms includes an extension section extending straightly toward said first metal plate, and a curved section extending curvedly from said extension section toward a curved section of the other one of said support arms, said curved sections of said support arms being located above said first metal plate.

6. The light emitting diode package of claim 5, wherein each of said two support arms includes a connecting section extending curvedly and upwardly from said second metal plate.

7. The light emitting diode package of claim 5, wherein said extension sections of said support arms of said second metal plate extend along a length direction in a parallel and symmetric manner.

8. The light emitting diode package of claim 5, wherein said curved sections are radially disposed above said first metal plate and surround a chip-mounting area that said LED chip is mounted thereon.

9. The light emitting diode package of claim 5, wherein curvatures of said curved sections of said support arms have a common center point on a line that connects a junction of said extension section and said curved section of one of said support arms to a junction of said extension section and said curved section of the other one of said support arms.

10. The light emitting diode package of claim 9, wherein ends of said curved sections of said support arms are spaced apart from each other and subtend an included angle at said common center point, said included angle ranging from 30 to 120 degrees.

11. The light emitting diode package of claim 1, wherein an indented portion is formed in said first bottom surface, and said first bottom surface is divided into two parts by said indented portion.

12. The light emitting diode package of claim 1, wherein said encapsulant includes a non-transparent frame portion and a transparent light exit portion, said frame portion defining a cavity that surrounds said LED chip, a material of said light exit portion filling said cavity and covering said LED chip.

13. The light emitting diode package of claim 12, wherein a fluorescent material is coated on a surface of said LED chip, or said fluorescent material is disposed on/into said light exit portion.

14. The light emitting diode package of claim 1, wherein said encapsulant is made in one piece from a transparent material, and includes a base portion and a lens body projecting from said base portion.

15. The light emitting diode package of claim 14, wherein a fluorescent material is coated on a surface of said LED chip, or said fluorescent material is disposed on/into said lens body.

16. The light emitting diode package of claim 1, wherein said first top surface of said first metal plate has an area smaller than that of said second top surface of said second metal plate.

17. A metallic frame of a light emitting diode package, comprising:

a first metal plate having a first top surface and a first bottom surface;

a second metal plate having a second top surface coplanar with said first top surface, and a second bottom surface coplanar with said first bottom surface, said first and second metal plates being arranged side by side with a first space therebetween; and two first support arms that extend integrally and respectively from two opposite ends of said second metal plate to a level higher than said second top surface and that further extend toward said first metal plate at a level higher than said first top surface crossing said first space, said first support arms being not in contact with said first metal plate.

18. The metallic frame of claim 17, further comprising a third metal plate and two second support arms, said third metal plate and said first metal plate being arranged side by side with a second space therebetween, said third metal plate having a third top surface coplanar with said first top surface, and a third bottom surface coplanar with said first bottom surface, said second support arms extending integrally and respectively from two opposite ends of said third metal plate to a level higher than said third top surface and further extending toward said first metal plate at a level higher than said first top surface crossing said second space, said second support arms being not in contact with said first metal plate.

19. The metallic frame of claim 18, wherein said first top surface of said first metal plate has an area larger than that of said second top surface of said second metal plate, and larger than that of said third top surface of said third metal plate.

20. The metallic frame of claim 19, wherein said first top surface of said first metal plate, said second top surface of said second metal plate and said third top surface of said third metal plate provided for chip-mounting or wire-bonding have a rectangular shape.

21. The metallic frame of claim 20, wherein (A)>(L)>(A/3), where (A) is total length of said first metal plate, said second metal plate, said third metal plate, said first space and said second space along a length direction of said first and second support arms, and (L) is length of each of said first and second support arms.

* * * * *